(12) United States Patent
Fehler et al.

(10) Patent No.: US 10,916,484 B2
(45) Date of Patent: Feb. 9, 2021

(54) ELECTRONIC DEVICE INCLUDING REDISTRIBUTION LAYER PAD HAVING A VOID

(71) Applicant: Infineon Technologies AG, Neubiberg (DE)

(72) Inventors: Robert Fehler, Regensburg (DE); Francesca Arcioni, Munich (DE); Christian Geissler, Teugn (DE); Walter Hartner, Bad Abbach-Peissing (DE); Gerhard Haubner, Regensburg (DE); Thorsten Meyer, Regensburg (DE); Martin Richard Niessner, Munich (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/014,745

(22) Filed: Jun. 21, 2018

(65) Prior Publication Data
US 2018/0374769 A1    Dec. 27, 2018

(30) Foreign Application Priority Data

Jun. 23, 2017  (DE) .................. 10 2017 210 654

(51) Int. Cl.
*H01L 23/498*    (2006.01)
*H01L 23/31*    (2006.01)
(Continued)

(52) U.S. Cl.
CPC ........ *H01L 23/3114* (2013.01); *H01L 21/568* (2013.01); *H01L 21/6835* (2013.01); *H01L 23/3171* (2013.01); *H01L 23/49816* (2013.01); *H01L 23/5389* (2013.01); *H01L 24/05* (2013.01); *H01L 23/49811* (2013.01); *H01L 24/13* (2013.01); *H01L 2224/0233* (2013.01); *H01L 2224/0235* (2013.01); *H01L 2224/0239* (2013.01); *H01L 2224/02375* (2013.01);
(Continued)

(58) Field of Classification Search
CPC ............... H01L 24/07; H01L 24/05; H01L 2224/32052; H01L 2224/05015; H01L 2224/0401; H01L 2224/02375
See application file for complete search history.

(56) References Cited

U.S. PATENT DOCUMENTS 3,823,469 A * 7/1974 Hegarty ............... H01L 24/06
                                                    228/180.22
6,239,703 B1 * 5/2001 Friedman .......... G08B 13/2431
                                                    257/E23.02
(Continued)

FOREIGN PATENT DOCUMENTS

JP    S57-119577 U    7/1982
JP    2002-280486    9/2002

*Primary Examiner* — Earl N Taylor
(74) *Attorney, Agent, or Firm* — Dicke, Billig & Czaja, PLLC (57) ABSTRACT

An electronic device is disclosed. In one example, the electronic device includes a solder ball, a dielectric layer comprising an opening, and a redistribution layer (RDL) comprising an RDL pad connected with the solder ball. The RDL pad including at least one void, the void being disposed at least in partial in an area of the RDL pad laterally outside of the opening of the dielectric layer.

21 Claims, 7 Drawing Sheets

(51) Int. Cl.
  *H01L 23/00* (2006.01)
  *H01L 21/683* (2006.01)
  *H01L 23/538* (2006.01)
  *H01L 21/56* (2006.01)
(52) U.S. Cl.
  CPC ............... *H01L 2224/0401* (2013.01); *H01L 2224/05008* (2013.01); *H01L 2224/05011* (2013.01); *H01L 2224/05012* (2013.01); *H01L 2224/05022* (2013.01); *H01L 2224/0558* (2013.01); *H01L 2224/05548* (2013.01); *H01L 2224/05555* (2013.01); *H01L 2224/05569* (2013.01); *H01L 2224/05572* (2013.01); *H01L 2224/05573* (2013.01); *H01L 2224/05624* (2013.01); *H01L 2224/05647* (2013.01); *H01L 2224/131* (2013.01); *H01L 2224/13006* (2013.01); *H01L 2224/13024* (2013.01)

(56) References Cited

U.S. PATENT DOCUMENTS

| | | | |
|---|---|---|---|
| 6,551,916 B2* | 4/2003 | Lin | H01L 24/05 257/780 |
| 6,825,541 B2* | 11/2004 | Huang | H01L 24/13 257/459 |
| 7,098,540 B1* | 8/2006 | Mohan | H01L 24/03 257/737 |
| 7,812,462 B2* | 10/2010 | Gee | H01L 24/05 257/786 |
| 8,508,043 B2* | 8/2013 | Daubenspeck | H01L 23/3171 257/737 |
| 8,647,974 B2* | 2/2014 | Topacio | H01L 24/05 438/612 |
| 8,766,441 B2* | 7/2014 | Chang | H01L 24/03 257/739 |
| 8,791,008 B2* | 7/2014 | Lin | H01L 23/3157 438/613 |
| 9,018,757 B2* | 4/2015 | Tsai | H01L 24/13 257/722 |
| 9,224,688 B2* | 12/2015 | Chuang | H01L 23/528 |
| 9,349,665 B2* | 5/2016 | Chen | H01L 24/10 |
| 9,355,978 B2* | 5/2016 | Chen | H01L 24/19 |
| 9,472,522 B2* | 10/2016 | Chen | H01L 24/09 |
| 9,633,961 B2* | 4/2017 | Chen | H01L 23/3171 |
| 9,633,963 B2* | 4/2017 | Chen | H01L 24/05 |
| 10,008,462 B2* | 6/2018 | Seo | H01L 24/02 |
| 10,037,955 B2* | 7/2018 | Chen | H01L 23/3171 |
| 10,256,202 B1* | 4/2019 | Spry | H01L 23/5226 |
| 2002/0185721 A1* | 12/2002 | Hwang | H01L 23/3114 257/678 |
| 2006/0091566 A1* | 5/2006 | Yang | H01L 24/05 257/786 |
| 2006/0214293 A1* | 9/2006 | Park | H01L 23/3114 257/737 |
| 2006/0237855 A1* | 10/2006 | Kroehnert | H05K 1/111 257/779 |
| 2007/0290343 A1* | 12/2007 | Harada | H01L 24/11 257/737 |
| 2008/0023851 A1* | 1/2008 | Andry | H01L 23/585 257/779 |
| 2009/0001567 A1* | 1/2009 | Shih | H01L 24/14 257/737 |
| 2009/0130840 A1* | 5/2009 | Wang | H01L 24/12 438/614 |
| 2009/0160052 A1* | 6/2009 | Yang | H01L 24/12 257/738 |
| 2009/0309216 A1* | 12/2009 | Jeon | H01L 24/11 257/737 |
| 2010/0244188 A1 | 9/2010 | Mihara | |
| 2010/0244239 A1* | 9/2010 | Bao | H01L 24/05 257/737 |
| 2011/0147922 A1* | 6/2011 | Bezama | H01L 24/03 257/737 |
| 2012/0126417 A1* | 5/2012 | Chiu | H01L 23/3171 257/774 |
| 2013/0147033 A1* | 6/2013 | Chen | H01L 23/562 257/737 |
| 2013/0241052 A1* | 9/2013 | Chang | H01L 23/49827 257/737 |
| 2013/0249105 A1* | 9/2013 | Lin | H01L 21/561 257/774 |
| 2014/0239496 A1* | 8/2014 | Lin | H01L 24/14 257/737 |
| 2014/0252610 A1* | 9/2014 | Chen | H01L 24/09 257/738 |
| 2015/0123269 A1* | 5/2015 | Chen | H01L 24/05 257/737 |
| 2015/0243613 A1* | 8/2015 | Chen | H01L 24/09 257/786 |
| 2016/0084887 A1* | 3/2016 | Beer | G01R 19/0092 324/126 |
| 2016/0133592 A1* | 5/2016 | Okumura | H01L 24/02 257/738 |
| 2016/0254238 A1* | 9/2016 | Chen | H01L 24/09 438/612 |
| 2017/0033064 A1* | 2/2017 | Chen | H01L 23/49838 |
| 2017/0084558 A1* | 3/2017 | Seo | H01L 23/3171 |
| 2017/0141055 A1* | 5/2017 | Liu | H01L 21/6835 |
| 2017/0221845 A1* | 8/2017 | Chen | H01L 23/562 |
| 2017/0271286 A1* | 9/2017 | Kim | H01L 24/05 |
| 2018/0026002 A1* | 1/2018 | Chen | H01L 24/03 257/738 |
| 2018/0374769 A1* | 12/2018 | Fehler | H01L 21/568 |
| 2019/0043822 A1* | 2/2019 | Falcon | H01L 24/30 |

* cited by examiner

ELECTRONIC DEVICE INCLUDING REDISTRIBUTION LAYER PAD HAVING A VOID

CROSS-REFERENCE TO RELATED APPLICATION

This Utility Patent Application claims priority to German Patent Application No. 10 2017 210 654.9, filed Jun. 23, 2017, which is incorporated herein by reference.

FIELD

The present disclosure relates to an electronic device and to a semiconductor device. The present disclosure relates in particular to an electronic device comprising a solder ball, and a redistribution layer pad connected with the solder ball, the redistribution layer pad comprising stress relief structures for increasing the interconnect reliability of ball grid array (BGA) package assemblies.

BACKGROUND

A ball grid array (BGA) is a type of semiconductor chip package used to permanently mount devices such as microprocessors or other types of integrated circuits. A BGA, as part of an electronic device, can provide more interconnection pins than other package types as in principle the whole bottom surface of the electronic device can be used for arranging solder balls or solder bumps thereon.

BGA package assemblies may, however, experience thermal-mechanical stress due to the thermal expansion missmatch of the materials involved and also due to mechanical stress loading coming from assembly in a module. The thermal-mechanical stress loading may lead to fatigue of interfaces and bulk materials. Examples of the fatigue-related observations in assembled BGA packages manufactured using a Fan-Out Wafer Level Package (e.g. eWLB (embedded wafer level ball grid array)) technology platform are solder ball fatigue, under bump metallization (UBM) fatigue, and redistribution layer (RDL) fatigue.

SUMMARY

In accordance with a first aspect of the disclosure, an electronic device comprises a solder ball, a dielectric layer comprising an opening, and a redistribution layer (RDL) comprising an RDL pad connected with the solder ball, the RDL pad comprising at least one void, the void being disposed at least in partial in an area of the RDL pad laterally outside of the opening of the dielectric layer.

In accordance with a second aspect of the disclosure, an electronic device comprises a solder ball, and a metal layer pad connected with the solder ball, the metal layer pad comprising at least one void, the void being formed as a slot, the slot comprising an elongated form arranged along a circular arc segment.

In accordance with a third aspect of the disclosure, a semiconductor device comprises a substrate, a first dielectric layer disposed on the substrate, a first metal layer pad disposed on the first dielectric layer, a second dielectric layer disposed on the first metal layer pad and on the first dielectric layer, the second dielectric layer comprising an opening, a second metal layer pad disposed on the first metal layer pad in the opening of the second dielectric layer, and a solder ball disposed on the second metal layer pad, wherein the first metal layer pad comprises at least one void, the void being disposed at least in partial laterally outside of the second metal layer pad, and the void being formed as a slot, the slot comprising an elongate form arranged along a circular arc segment.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

FIG. 3 comprises FIGS. 3A and 3B and shows a schematic top view representation (A) and cross-sectional side view representation (B) of an electronic device according to an example in which the electronic device comprises two almost semi-circular slots.

FIG. 4 comprises FIGS. 4A and 4B and shows a schematic top view representation (A) and cross-sectional side view representation (B) of an electronic device according to an example in which the electronic device comprises an almost full-circle slot.

FIG. 5 comprises FIGS. 5A and 5B and shows a schematic top view representation (A) and cross-sectional side view representation (B) of an electronic device according to an example in which the electronic device comprise one almost semi-circular slot.

FIG. 6 comprises FIGS. 6A and 6B and shows a schematic top view representation (A) and cross-sectional side view representation (B) of an electronic device according to an example in which the electronic device comprises two almost quarter-circle slots.

FIG. 7 comprises FIGS. 7A and 7B and shows a schematic top view representation (A) and cross-sectional side view representation (B) of an electronic device according to an example in which the electronic device comprises one semi-circular slot.

DETAILED DESCRIPTION

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct physical or electrical contact with each other. Also, the term "exemplary" is merely meant as an example, rather than the best or optimal. The following detailed description, therefore, is not to be taken in a limiting sense, and the scope of the present disclosure is defined by the appended claims.

The electronic device may comprise a semiconductor die or semiconductor chip, which may comprise contact elements or contact pads on one or more of its outer surfaces wherein the contact elements are electrically connected with the electrical circuit, e.g. the transistor, of the respective semiconductor die and serve for electrically connecting the semiconductor die to the outside. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, e.g. from aluminum and copper, or an electrically conducting organic material, or an electrically conducting semiconductor material. The contact elements may also be formed as layer stacks of one or more of the above-mentioned or further materials so as to create, for example, a stack of NiPdAu.

The examples of an electronic device may comprise an encapsulant or encapsulating material having the semiconductor chip embedded therein. The encapsulating material can be any electrically insulating material like, for example, any kind of molding material, any kind of resin material, or any kind of epoxy material, a bismaleimide, or a cyanate ester. The encapsulating material can also be a polymer material, a polyimide material, a thermoplastic material, a ceramic material, and a glass material. The encapsulating material may also comprise any of the above-mentioned materials and further include filler materials embedded therein like, for example, thermally conductive increments. These filler increments can be made of SiO, Al2O3, ZnO, AlN, BN, MgO, Si3N4, or ceramic, or a metallic material like, for example, Cu, Al, Ag, or Mo. Furthermore the filler increments may have the shape of fibers and can be made of carbon fibers or nanotubes, for example.

Figure 1:
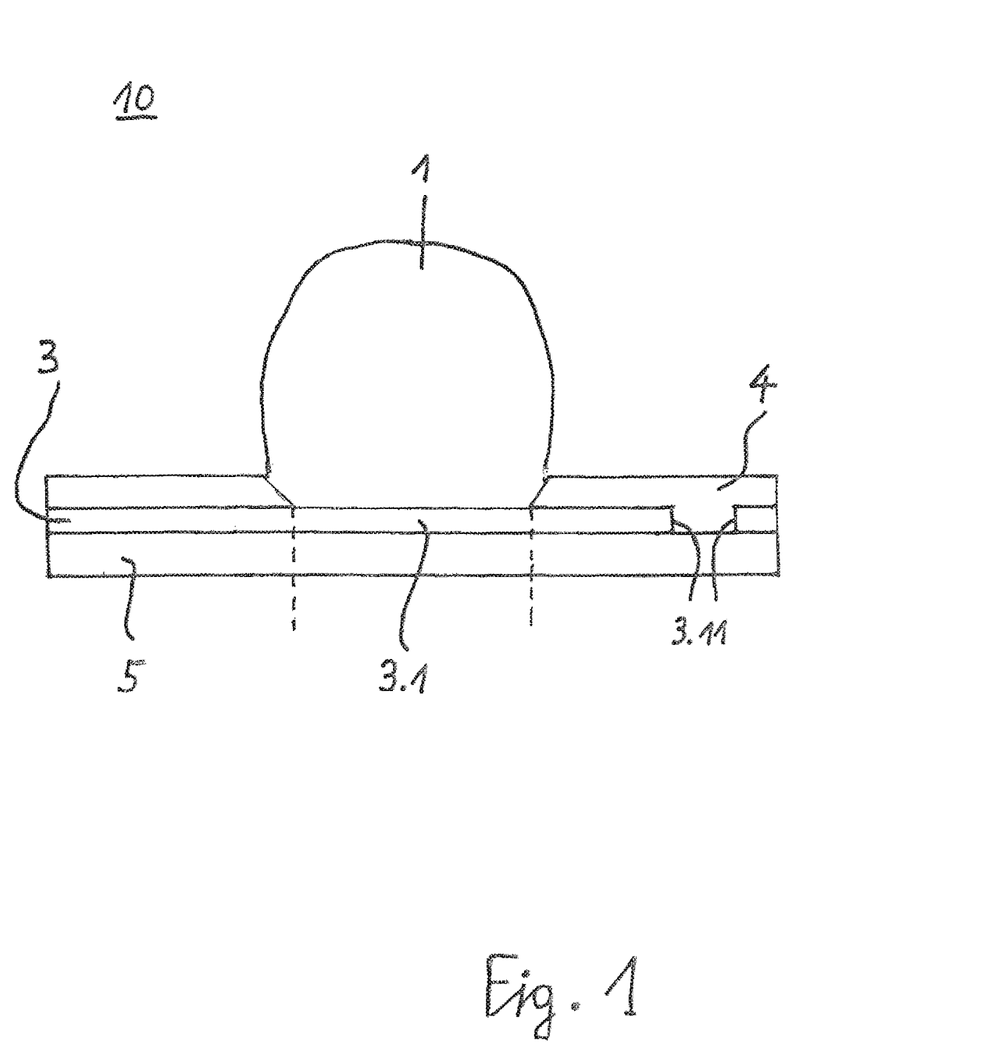
FIG. 1 shows a schematic cross-sectional side view representation of an electronic device according to an example in which the solder ball is connected directly with the redistribution layer (RDL) pad.
Figure 2:
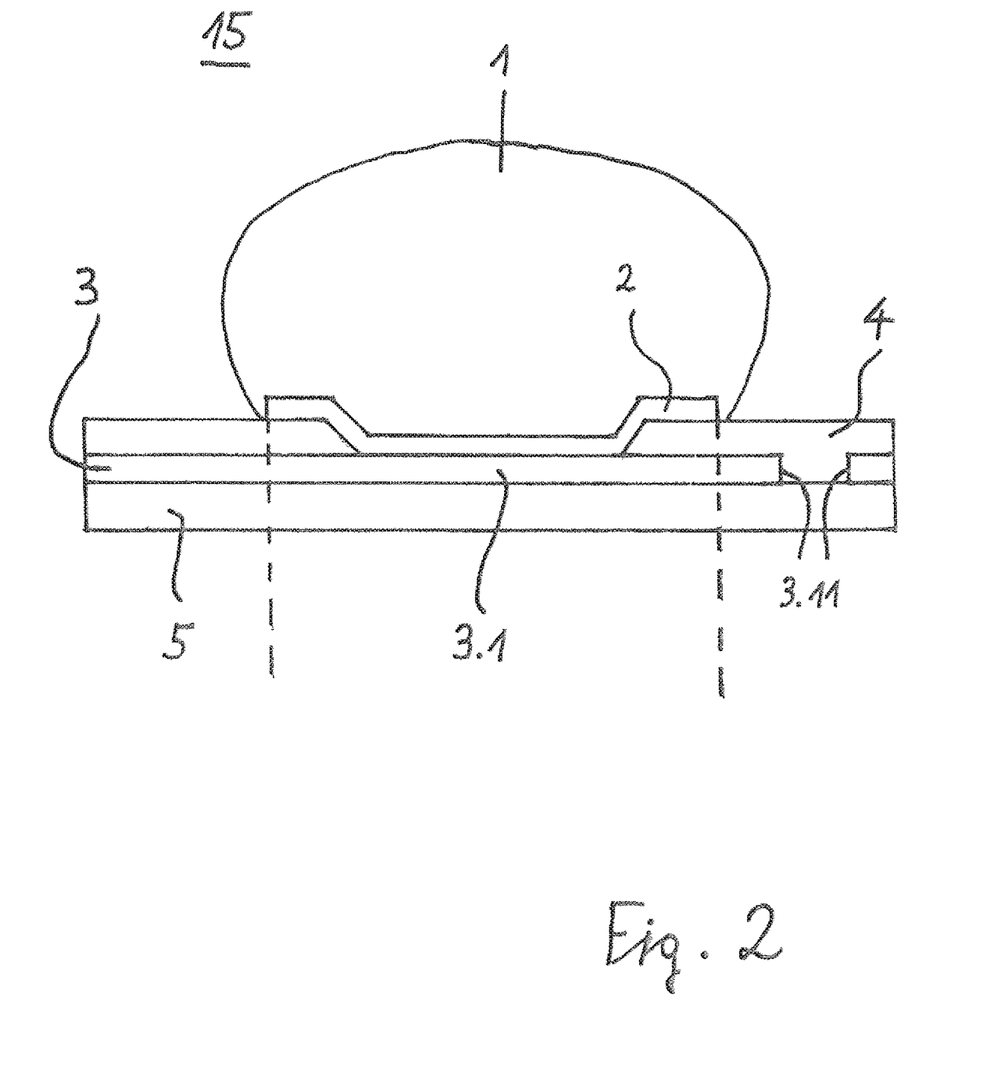
FIG. 2 shows a schematic cross-sectional side view representation of an electronic device according to an example in which the solder ball is connected with the RDL pad via an under bump metallization (UBM) pad.

FIGS. 1 and 2 show examples of an electronic device according to the first aspect, wherein the devices shown in FIGS. 1 and 2 represent a general idea of the present disclosure which is to design stress relief structures into the redistribution layer pad in order to reduce or even prevent redistribution layer fatigue. This is done by increasing the mechanical flexibility of the redistribution layer pad in order to allow for better solder ball movement or displacement which results in turn into a lower stress load on the redistribution layer pad.

The electronic device 10 as shown in FIG. 1 comprises a solder ball 1, a dielectric layer 4 comprising an opening, and a redistribution layer (RDL) 3 comprising an RDL pad 3.1 connected with the solder ball 1, the RDL pad 3.1 comprising at least one void 3.11, the void 3.11 being disposed at least in partial in an area of the RDL pad 3.1 laterally outside of the opening of the dielectric layer 4. The RDL 3 may be disposed on a substrate 5 which can be, for example, a further dielectric layer or an encapsulation layer. More specific examples thereof will be shown and explained later.

The electronic device 10 of FIG. 1 thus comprises a direct connection between the solder ball 1 and the RDL pad 3.1 wherein the solder ball 1 is connected to the RDL pad 3.1 within the opening of the dielectric layer 4. It is, however, also possible that the electronic device contains an additional under bump metallization (UBM) as will be shown in the following.

The electronic device 15, as shown in FIG. 2, comprises a solder ball 1, an under bump metal (UBM) layer pad 2 connected with the solder ball 1, and a redistribution layer (RDL) 3 comprising an RDL pad 3.1 connected with the UBM layer pad 2. The solder ball is thus connected (for example, electrically connected) with the RDL pad 3.1 through the UBM layer pad 2. The RDL pad 3.1 comprises at least one void 3.11, the void 3.11 being disposed at least in partial in an area of the RDL pad 3.1 laterally outside of the UBM layer pad 2. The RDL 3 and the UBM layer pad 2 may be made from, for example, Cu or Al. The UBM layer pad 2 may also comprise a layer stack with at least one layer comprising Cu or Al or alloys thereof.

The void 3.11 acts as the stress relief structure and can be formed manifold. Different examples of voids will be presented in the following, wherein each one provides a resilient suspension of the RDL pad and thus allows for tilting and tottering of the solder ball.

With respect to the examples of an electronic device as shown in FIGS. 1 and 2 it was stated above that the void 3.11 is located laterally outside of the opening of the dielectric layer 4 (FIG. 1) or laterally outside of the UBM pad 2. It is to be understood that in both examples the technical term "laterally outside . . . " is to be understood in a sense that the void 3.11 is located laterally outside of an orthogonal projection of the opening of the dielectric layer 4 or the UBM pad 2 onto the plane of the RDL 3, i.e. an orthogonal projection such as indicated by the dashed lines in FIGS. 1 and 2.

In the following, specific features, their properties and advantages will be described, wherein these features will be described in further detail in connection with the further figures.

According to examples of the electronic devices 10 or 15 of the first aspect, the void 3.11 is disposed completely in an area of the RDL pad 3.1 laterally outside of the opening of the dielectric layer 4 or even completely laterally outside of the UBM layer pad 2. Such examples are shown in FIG. 1 or 2, wherein the dashed lines indicate the lateral extension of the opening of the dielectric layer 4 or of the UBM layer pad 2, respectively. It can be clearly seen that the void 3.11 is disposed completely laterally outside of the UBM layer pad 2.

According to examples of the electronic devices 10 or 15 of the first aspect, the void is disposed partially in an area of the RDL pad laterally outside of the opening of the dielectric layer or of the UBM layer pad and partially in an area of the RDL pad laterally inside of the opening of the dielectric layer or of the UBM layer pad. In such an example the void would be disposed in such a way that in FIG. 1 or 2 one of the dashed lines would pass through the void.

According to examples of the electronic devices 10 or 15 of the first aspect, the RDL pad 3.1 comprises no void in an area of the RDL pad laterally inside of the opening of the dielectric layer in FIG. 1 or of the UBM layer pad 2 in FIG. 2.

According to an example of the electronic device 15 of the first aspect, one or more of the UBM pad 2 and the RDL pad 3.1 comprises a circular form in a top view thereupon.

According to examples of the electronic devices 10 or 15 of the first aspect, the RDL pad 3.1 comprises two or more voids. According to a further example thereof, the two or more voids are formed either different, similar or identical in shape. Specific examples thereof will be shown and described in connection with some of the further Figures below.

According to examples of the electronic devices 10 or 15 of the first aspect, the RDL pad comprises two or more voids, wherein the two or more voids are all positioned at an identical radial distance from a center point of the RDL pad 3.1. In particular, the RDL pad 3.1 may comprise an essentially circular form so that the center point of the RDL pad 3.1 is given by the circle center point and the two or more voids are positioned at identical radii from the circle center point.

According to examples of the electronic devices 10 or 15 of the first aspect, the void 3.11 comprises the form of a slot, the slot comprising an elongated form having a length and a width, wherein the length is greater than the width. More specifically, the length of the slot may be at least 3 times, more specifically at least 4 times, more specifically at least 5 times the width of the slot.

According to a further example thereof, the slot comprises a width in a range from 5 µm to 100 µm. The slot may comprise a spatially constant or a variable width.

According to a further example thereof, the slot is arranged along a circular arc segment. According to a further example thereof, the circular arc segment extends over almost a complete circumference of a circle. According to another example, the circular arc segment extends over almost complete circumference of a semi-circle. According to another example, the circular arc segment extends over a complete circumference of a semi-circle. According to another example, two slots are provided, each one of which extends over almost a complete circumference of a semi-circle.

According to another example, two slots are provided, wherein each one extends over almost a complete circumference of quarter-circle.

According to examples of the electronic devices 10 and 15 of the first aspect, the one or more voids are formed and arranged such that an inner portion of the RDL pad is suspended by two torsional springs or by one cantilever spring. Examples thereof will be shown further below. By forming slots comprising spatially variable slot width it may also be possible to generate springs having spatially variable strength.

Up to now it was explained herein the general idea of introducing voids into a metallization layer on the side of the semiconductor package in order to provide relief structures. It should be mentioned at this point that this idea could in principle also be applied to the PCB on the customer side, in particular to one or more of the metallization layers which make direct or indirect electrical contact with the solder ball on the package side.

An electronic device according to a second aspect of the disclosure comprises a solder ball and a metal layer pad connected with the solder ball, the metal layer pad comprising at least one void, the void being formed as a slot, the slot comprises an elongated form arranged along a circular arc segment. According to an example thereof, the solder ball can be directly connected with the metal layer pad. Accordingly to another example thereof, the solder ball can be indirectly connected with the metal layer pad, i.e. there can be any kind of intermediate layer between them, as for example an under bump metal (UBM) layer pad.

According to an example of the electronic device of the second aspect, the electronic device further comprises a redistribution line (RDL) and the metal layer pad may be given by an RDL pad being connected with the RDL.

According to an example of the electronic device of the second aspect, the electronic device may comprise a further metal layer pad which may be given by an under bump metal (UBM) layer pad being directly connected with the solder ball. According to a further example thereof, the void is disposed at least in partial in an area of the RDL pad laterally outside of the UBM layer pad.

According to an example of the electronic device of the second aspect, the electronic device further comprises a dielectric layer comprising an opening wherein the solder ball is connected with the RDL pad or with the UBM pad through the opening. According to a further example thereof the void is disposed at least in partial in an area of the RDL pad laterally outside of the opening of the dielectric layer.

Further examples of the electronic device of the second aspect may be formed by adding further examples or features as were described above in connection with the electronic device of the first aspect or other examples of features described further below.

The further FIGS. 3-7 show specific examples of an electronic device according to either one of the first or the second aspect. These examples are ones in which the respective electronic devices contain an UBM layer pad like in the example of FIG. 2. However it is to be noted that these examples are as well applicable to a variant in which the electronic device does not contain an UBM layer pad like in the example of FIG. 1.

Figure 3A:
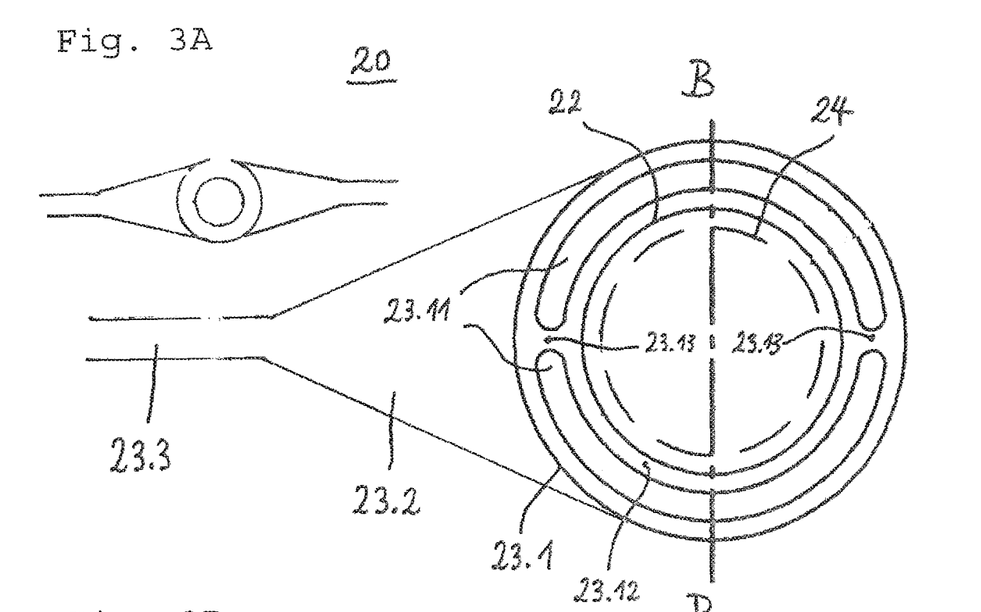
Figure 3B:
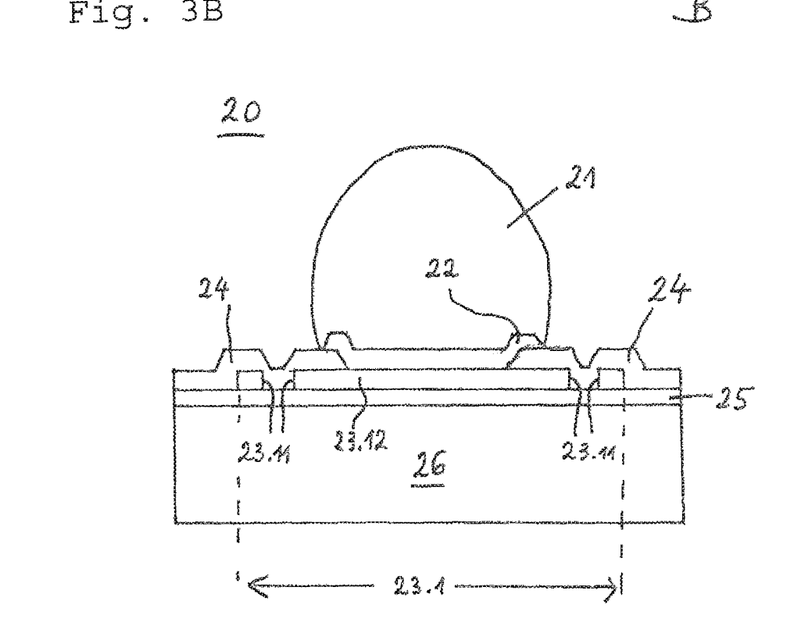

FIG. 3 comprises FIGS. 3A and 3B and shows a top view representation (A) and a cross-sectional side view representation (B) of an electronic device comprising two voids both extending over almost a complete circumference of a semi-circle.

The electronic device 20 of FIG. 3 comprises a substrate 26, a first dielectric layer 25 disposed on the substrate 26, an RDL pad 23.1 disposed on the first dielectric layer 25, a second dielectric layer 24 disposed on the RDL pad 23.1, an UBM layer pad 22 disposed on the RDL pad 23.1, and a solder ball 21 disposed on the UBM layer pad 22. The second dielectric layer 24 comprises an opening, wherein the UBM layer pad 22 is disposed on the RDL pad 23.1 in the opening of the second dielectric layer 24. The reference sign 24 in FIG. 3A denotes the inner circumference of the second dielectric layer 24. The RDL pad 23.1 comprises two voids 23.11 comprising the form of two semi-circular slots 23.11 as can be seen in FIG. 3A.

FIG. 3B is a cross-section along a line B-B of FIG. 3A so that the cross-section of FIG. 3B depicts the two semi-circular slots 23.11 on either lateral sides of the UBM layer pad 22.

FIG. 3A shows that due to the form of the two almost semi-circular slots 23.11 the RDL pad 23.1 comprises an inner portion 23.12 which is connected with an outer portion of the RDL pad 23.1 only via two constricted areas 23.13. These constricted areas 23.13 effectively function as torsional springs allowing a rotational movement of the inner portion 23.12 around an axis which is perpendicular to the B-B axis. In such a way the inner portion 23.12 which carries the solder ball 21 may resiliently slip back in case of any movement of the solder ball 21, e.g. tilting or tottering of the solder ball 21. By the way, the current flows into the RDL pad 23.1 through the constricted areas 23.13 and from the RDL pad 23.1 to the solder ball 21 which should be no problem due to the thickness of the RDL 23 which is in the range of 5 µm to 10 µm.

The substrate 26 may comprise, for example, an encapsulation layer which may be fabricated of materials mentioned above. The encapsulation layer may encapsulate a semiconductor die or semiconductor chip which is not shown in the Figures. The substrate 26 may alternatively comprise or consist of a dielectric material or a semiconductor material of e.g. a semiconductor chip.

FIG. 3A further shows the RDL 23 in more detail. In particular, the RDL 23 comprises an RDL pad 23.1, an RDL transition region 23.2, and an RDL line 23.3. The RDL line 23.3 may, for example, lead to a semiconductor die, in particular to a contact pad of a semiconductor die and can be connected to the contact pad by a via connection through the substrate 26. The RDL transition region 23.2 may be formed as shown in FIG. 2A wherein the width of the RDL line 23.3 is continuously increased until the RDL transition region 23.2 reaches the outer periphery of the circular formed RDL pad 23.1. The RDL transition region 23.2 can also have a different shape. Alternatively it is also possible that there exists no particular RDL transition region 23.2 and instead the RDL line 23.3 comprises a constant width until it reaches the outer periphery of the RDL pad 23.1.

According to FIG. 3A the RDL pad 23.1 is connected with only one RDL line 23.3 via the RDL transition region 23.3. However, it can also be the case that the RDL pad 23.1 is connected with more than one RDL line. In particular, the RDL pad 23.1 can be connected with a further RDL line. The further RDL line can be connected to the RDL pad 23.1 in the same way as the RDL line 23.3 or in a different way and it can be connected to the RDL pad 23.1 directly opposite to the RDL line 23.3 (see the insert in FIG. 3A).

It should be added that the void position and the void count are independent of the outer connection of the one or more RDL lines to the RDL pad. It means that in either one of the one or two sided RDL connection shown in FIG. 3 the arrangement of the voids can, for example, be rotated by 90° with respect to the arrangement as shown in FIG. 3A in which case of course the axis of rotational movement of the inner position would lie different as the positions of the torsional springs would be different. Moreover, in case of the two sided connection as shown in the inset of FIG. 3A is not necessary that on each side of an RDL connection a void is provided. There can, for example, be just one semi-circle void on one side of an RDL connection and no one on the side of the opposite RDL connection.

It should further be added that the pad 23.1 can completely or partially be enclosed by a further metal layer like copper. It means that even in the case of a one sided RDL connection such as shown in FIG. 3A there can be provided a further copper layer on the right side, such further copper layer adjoining the pad 23.1 on the right side and surrounding either only the right half of the pad 23.1 or even surrounding the pad 23.1 completely.

Figure 4A:
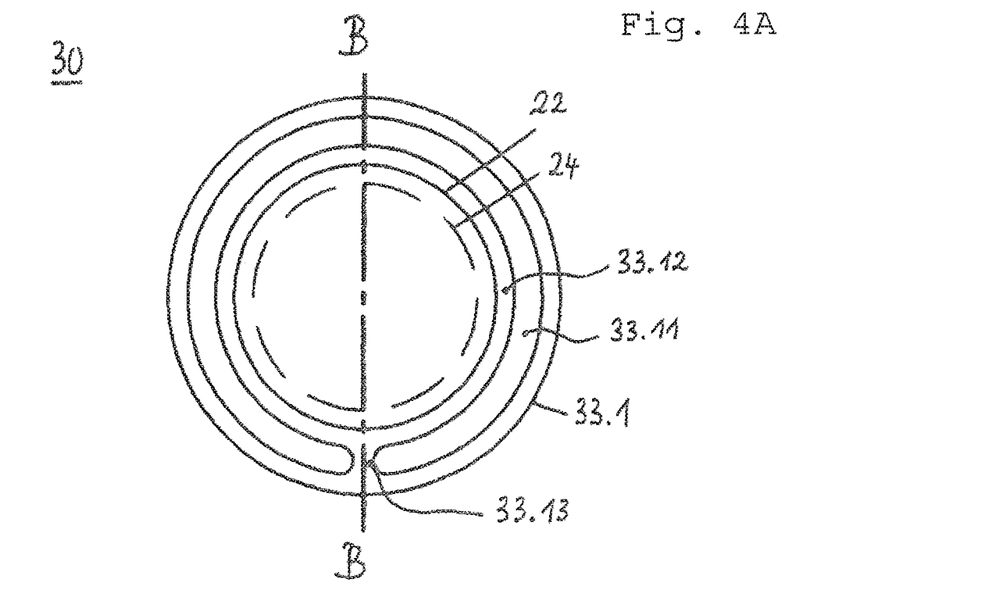
Figure 4B:
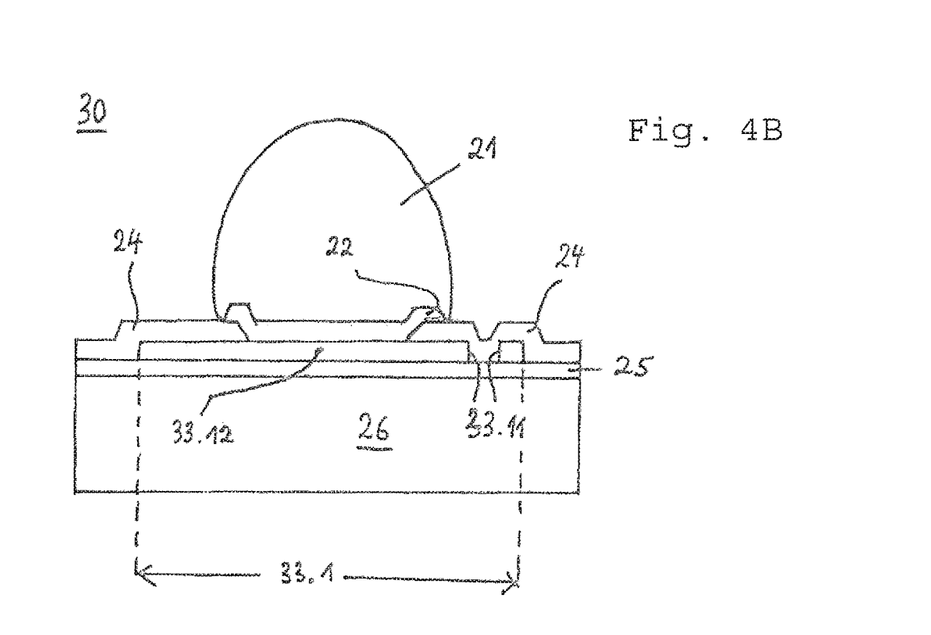

FIG. 4 comprises FIGS. 4A and 4B and shows a top view representation (A) and a cross-sectional side view representation (B) of an example of an electronic device comprising one slot extending over almost a complete circumference of a circle. The electronic device 30 of FIG. 4 comprises the same layer structure as the electronic device 20 of FIG. 3 so that details thereof will not be repeated here and the same reference signs are used as in FIG. 3 except the RDL pad 33.1 and the slot 33.11. The cross-sectional view of FIG. 4B is along line B-B of FIG. 4A which goes through the void 33.11 on one lateral side of the UBM layer pad 22.

FIG. 4A shows that due to the form of the one almost circumferential circular slot 33.11 the RDL pad 33.1 comprises an inner portion 33.12 which is connected with an outer portion of the RDL pad 33.1 only via one constricted areas 33.13. These constricted area 33.13 effectively functions as an cantilever spring allowing a rotational movement of the inner portion 33.12 around an axis which goes through the constricted area 33.13 parallel to the plane of the paper sheet and perpendicular to the B-B axis. In such a way the inner portion 33.12 which carries the solder ball 21 may resiliently slip back in case of any movement of the solder ball 21, e.g. tilting or tottering of the solder ball 21. By the way, the current flows into the RDL pad 33.1 through the constricted area 33.13 and from the RDL pad 33.1 to the solder ball 21 which should be no problem due to the thickness of the RDL 33 which is in the range of 5 µm to 10 µm.

Figure 5A:
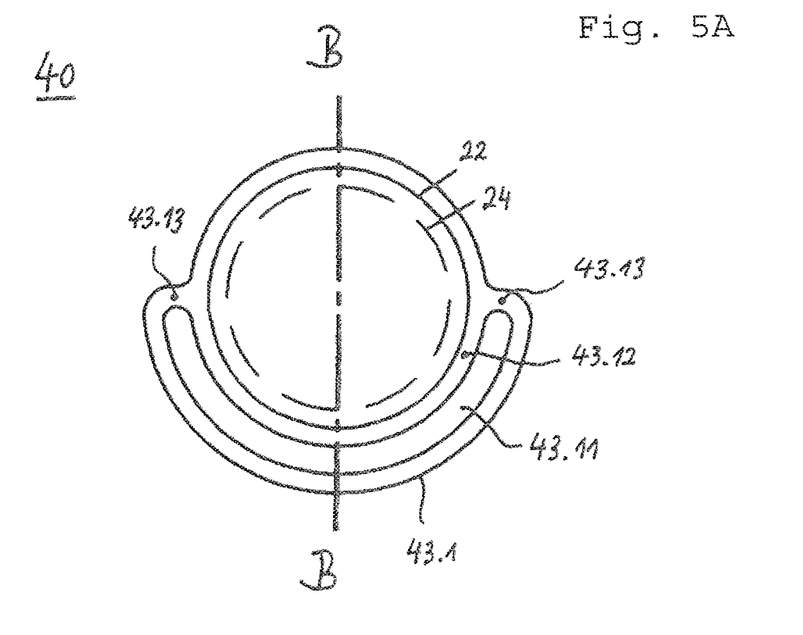
Figure 5B:
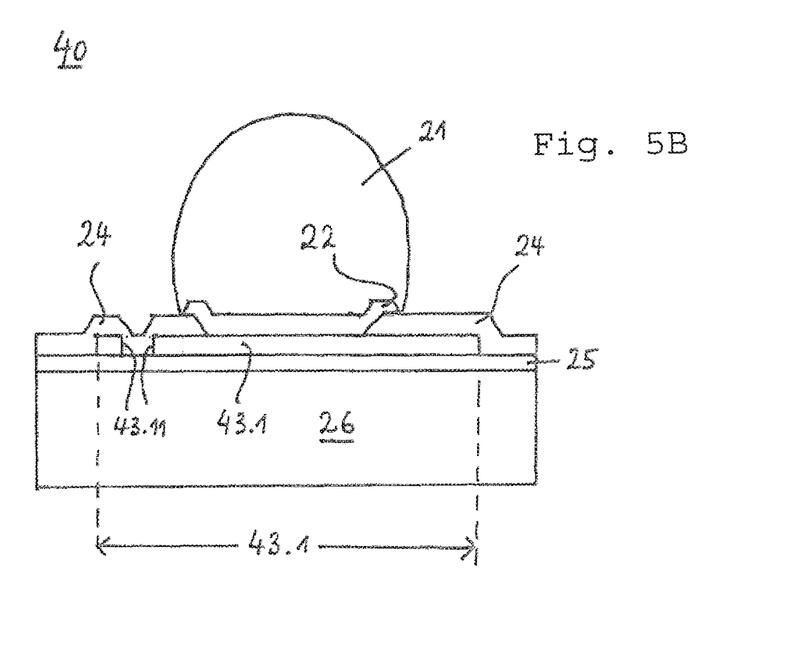

FIG. 5 comprises FIGS. 5A and 5B and shows a top view representation (A) and a cross-sectional side view representation (B) of an electronic device according to a further example in which one slot is provided which extends over almost a complete circumference of a semi-circle. The electronic device 40 of FIG. 5 comprises the same layer structure as the electronic device 20 of FIG. 3 so that details thereof will not be repeated here and the same reference signs are used as in FIG. 3 except the RDL pad 43.1 and the slot 43.11. The cross-sectional view of FIG. 5B is along line B-B of FIG. 5A which goes through the void 43.11 on one lateral side of the UBM layer pad 22. The RDL pad 43.1 comprises an inner portion 43.12 which is connected with the outer portion by two constricted areas 43.13 which act as torsional springs in a similar way as was explained in the example of FIG. 3.

Figure 6A:
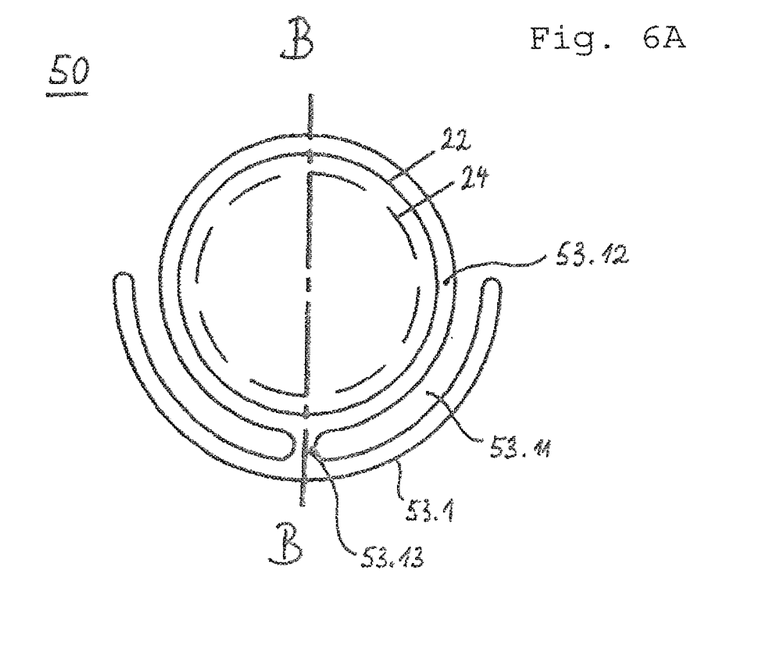
Figure 6B:
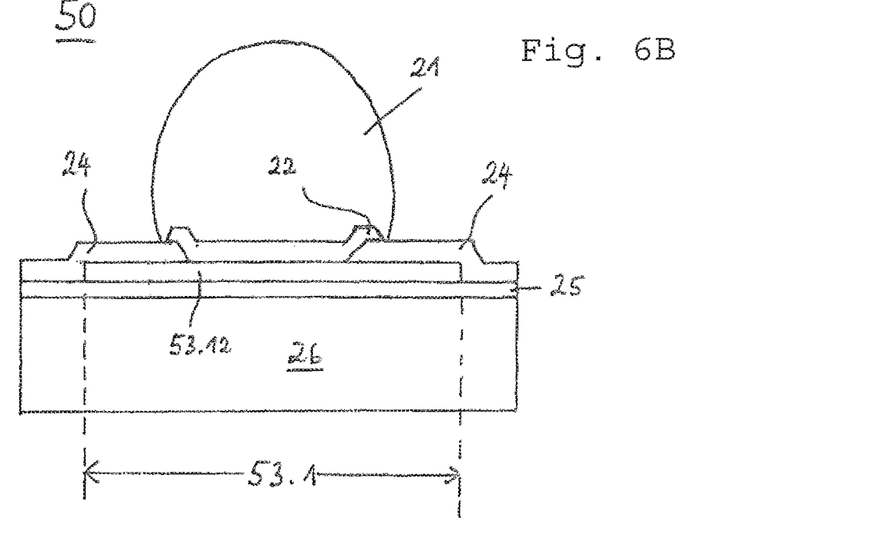

FIG. 6 comprises FIGS. 6A and 6B and shows a top view representation (A) and a cross-sectional side view representation (B) of an electronic device according to a further example in which two slots are provided both extending over almost a quarter-circle. The electronic device 50 of FIG. 6 comprises the same layer structure as the electronic device 20 of FIG. 3 so that details thereof will not be repeated here and the same reference signs are used as in FIG. 3 except the RDL pad 53.1 and the two slots 53.11. The cross-sectional view of FIG. 6B is along line B-B of FIG. 6A. In this case line B-B does not go through the slots 53.11 so that they are not visible in the cross-sectional view of FIG. 6B. The RDL pad 53.1 comprises an inner portion 53.12 which is connected with the outer portion by one constricted area 53.13 which acts as a cantilever spring in a similar way as was explained in the example of FIG. 4.

Figure 7A:
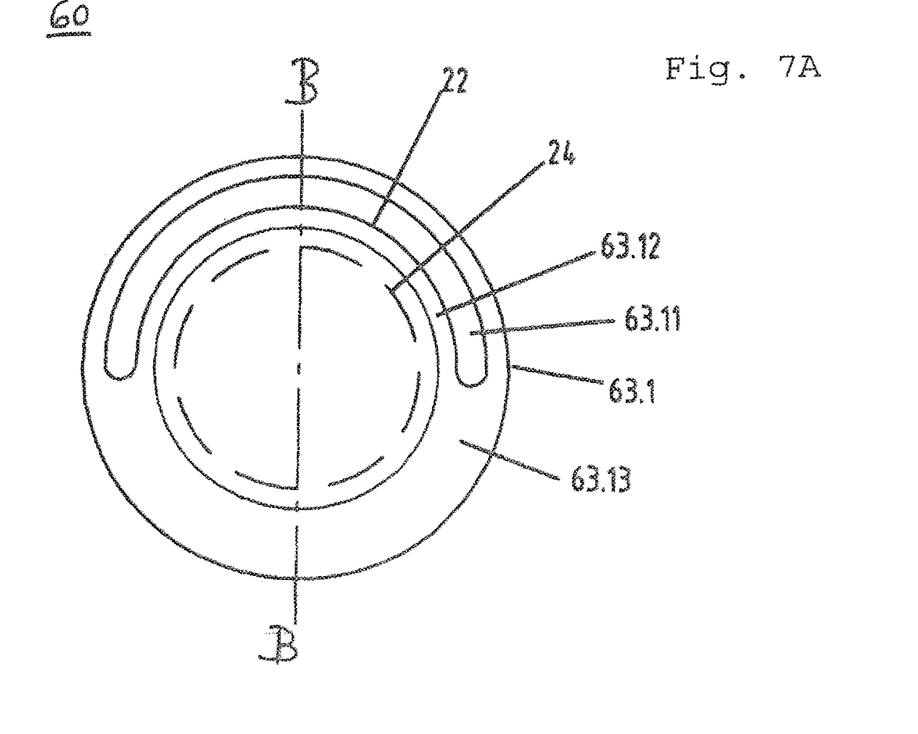
Figure 7B:
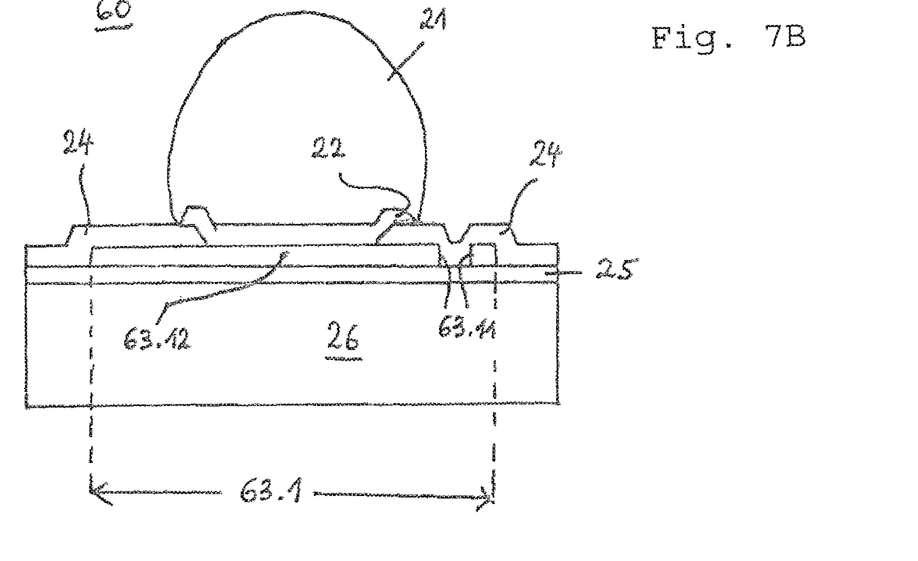

FIG. 7 comprises FIGS. 7A and 7B and shows a top view representation (A) and a cross-sectional side view representation (B) of an electronic device according to a further example in which one slot is provided which extends over a complete circumference of a semi-circle. The electronic device 60 of FIG. 7 comprises the same layer structure as the electronic device 30 of FIG. 4 so that details thereof will not be repeated here and the same reference signs are used as in FIG. 4 except the RDL pad 63.1 and the slot 63.11. The cross-sectional view of FIG. 7B is along line B-B of FIG. 7A which goes through the void 63.11 on one lateral side of the UBM layer pad 22. One difference to the example of FIG. 4 is that the RDL pad 63.1 comprises an inner portion 63.12 which is connected to the outer portion 63.1 with the forming of a constricted area 63.13, significantly wider than 33.13 as in the example of FIG. 4. As a result, the inner portion is suspended by a spring possessing mechanical properties or behavior of both a cantilever and a torsional spring.

The present disclosure also relates to a semiconductor device according to a third aspect. The semiconductor device of the third aspect comprises a substrate, a first dielectric layer disposed on the substrate, a first metal layer pad disposed on the first dielectric layer, a second dielectric layer disposed on the first metal layer pad and on the first dielectric layer, the second dielectric layer comprising an opening, a second metal layer pad disposed on the first metal pad in the opening of the second dielectric layer, and a solder ball disposed on the second metal layer pad, wherein the first metal layer pad comprises at least one void, the void being disposed at least in partial laterally outside of the opening of the second dielectric layer or even outside of the second metal layer pad, and the void being formed as a slot, the slot comprising an elongated form arranged along a circular arc segment.

Examples of a semiconductor device according to the third aspect are shown in FIGS. 3 to 6 as were described in detail above. The first metal layer pad can be given by the RDL pad and the second metal layer pad can be given by the UBM layer pad.

According to an example of the semiconductor device of the third aspect, the semiconductor device further comprises a redistribution line (RDL), wherein the first metal layer pad is part of and integral with the RDL as shown in the examples of an electronic device in FIGS. 1 and 2, and the substrate may comprise or be connected with a semiconductor die, the semiconductor die may comprise a contact pad, the contact pad being connected with the first metal layer pad by means of the RDL and a via formed in the dielectric layer underneath the RDL. The substrate may comprise or consist of an encapsulation layer which embeds the semiconductor die in which case the via would also have to be formed in the encapsulation layer.

Further examples of a semiconductor device of the third aspect can be formed by combining with one or more of the examples or features as were described above in connection with an electronic device of the first aspect or the second aspect.

The present disclosure also relates to a method for fabricating an electronic device according to a fourth aspect. The method comprises providing a redistribution layer (RDL), structuring in the RDL a RDL pad, in particular one which has a circular form, and structuring at least one void in the RDL pad.

According to an example of the method of the fourth aspect, the method further comprises fabricating an under bump metal (UBM) metal pad above said RDL pad in such a way that the at least one void is disposed at least in partial in an area of the RDL pad laterally outside of the UBM.

Further examples of the method of the fourth aspect can be formed by combining with one or more of the examples or features as were described above in connection with an electronic device of the first aspect or the second aspect and a semiconductor device of the third aspect.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. An electronic device, comprising:
   a solder ball;
   a dielectric layer comprising an opening; and
   a redistribution layer (RDL) comprising an RDL pad electrically connected with the solder ball within the opening;
   the RDL pad comprising at least one void opening through the RDL pad, the at least one void opening being disposed at least in partial in an area of the RDL pad laterally outside of the opening of the dielectric layer, the at least one void opening comprising either one circumferential circular slot or two semi-circular slots, wherein the one circumferential circular slot includes an inner portion connected with an outer portion of the RDL pad by one constricted area which functions as a cantilever spring that allows a rotational movement of the inner portion of the one circumferential circular slot around an axis which is perpendicular to the RDL pad, and wherein the two semi-circular slots include an inner portion connected with an outer portion of the RDL pad by two constricted areas which function as torsional springs that allow a rotational movement of the inner portion of the two semi-circular void openings around an axis which is perpendicular to the RDL pad.

2. The electronic device according to claim 1, further comprising:

the at least one void opening being disposed completely in an area of the RDL pad laterally outside of the opening of the dielectric layer.

3. The electronic device according to claim 1, further comprising
an under bump metal (UBM) layer pad connected with the solder ball, wherein
the at least one void opening being disposed at least in partial in an area of the RDL pad laterally outside of the UBM layer pad.

4. The electronic device according to claim 3, further comprising:
the at least one void opening being disposed completely in an area of the RDL pad laterally outside of the UBM layer pad.

5. The electronic device according to claim 1, further comprising:
the at least one void opening not being disposed in an area of the RDL pad laterally inside of the opening of the dielectric layer.

6. The electronic device according to claim 1, further comprising:
the slot or the slots of the at least one void opening having a length and a width, wherein the length is greater than the width.

7. The electronic device according to claim 6, further comprising:
the slot or the slots comprise a width in a range from 5 μm to 100 μm.

8. The electronic device according to claim 6, further comprising:
the slot or the slots being arranged along a circular arc segment.

9. The electronic device according to claim 3, further comprising:
the UBM layer pad is disposed on the RDL pad in the opening of the dielectric layer.

10. The electronic device according to claim 1, further comprising:
the RDL comprising a redistribution line connected to the RDL pad.

11. An electronic device comprising:
a solder ball;
a dielectric layer comprising an opening; and
a metal layer pad electrically connected with the solder ball through the opening, the metal layer pad comprising at least one void opening through the metal layer pad, the at least one void opening disposed laterally outside of the opening of the dielectric layer, the at least one void opening being formed as at least one slot, the at least one slot comprising either one circumferential circular slot or two semi-circular slots, wherein the one circumferential circular slot includes an inner portion connected with an outer portion of the metal layer pad by one constricted area which functions as a cantilever spring that allows a rotational movement of the inner portion of the one circumferential circular slot around an axis which is perpendicular to the metal layer pad, and wherein the two semi-circular slots include an inner portion connected with an outer portion of the metal layer pad by two constricted areas which function as torsional springs that allow a rotational movement of the inner portion of the two semi-circular void openings around an axis which is perpendicular to the metal layer pad.

12. The electronic device according to claim 11, further comprising:
an under bump metal (UBM) layer pad connected between the solder ball and the metal layer pad.

13. The electronic device according to claim 11, further comprising:
the at least one slot comprising a length and a width, wherein the length is at least 3 times the width.

14. The electronic device according to claim 11, further comprising:
the at least one slot is the circumferential circular slot arranged along a circular arc segment, wherein the circular arc segment extends over almost a complete circumference of a circle.

15. The electronic device according to claim 11, further comprising:
the at least one slot is the two semi-circular slots, wherein each one of the two semi-circular slots is arranged along a circular arc segment, and each one of the circular arc segment extends over almost a complete circumference of a semi-circle.

16. The electronic device according to claim 11, further comprising:
the at least one slot is the circumferential circular slot arranged along a circular arc segment, wherein the circular arc segment extends over almost a complete circumference of a semi-circle or over a complete circumference of a semi-circle.

17. The electronic device according to claim 11, further comprising:
the at least one slot is the two semi-circular slots, wherein each one of the two semi-circular slots is arranged along a circular arc segment, and each one of the circular arc segments extends over almost a complete circumference of a quarter-circle.

18. A semiconductor device, comprising:
a substrate;
a first dielectric layer disposed on the substrate;
a first metal layer pad disposed on the first dielectric layer;
a second dielectric layer disposed on the first metal layer pad and on the first dielectric layer, the second dielectric layer comprising an opening;
a second metal layer pad disposed on the first metal layer pad in the opening of the second dielectric layer; and
a solder ball disposed on the second metal layer pad;
wherein the first metal layer pad comprises at least one void opening through the first metal layer pad, the at least one void opening being disposed laterally outside of the second metal layer pad, the at least one void opening being disposed laterally outside of the solder ball, and the at least one void opening being formed as at least one slot, the at least one slot comprising either one circumferential circular slot or two semi-circular slots, wherein the one circumferential circular slot includes an inner portion connected with an outer portion of the first metal layer pad by one constricted area which functions as a cantilever spring that allows a rotational movement of the inner portion of the one circumferential circular slot around an axis which is perpendicular to the first metal layer pad, and wherein the two semi-circular slots include an inner portion connected with an outer portion of the first metal layer pad by two constricted areas which function as torsional springs that allow a rotational movement of the inner portion of the two semi-circular void openings around an axis which is perpendicular to the first metal layer pad.

19. The semiconductor device according to claim 18, wherein the substrate comprises or consists of an encapsulation layer.

20. The semiconductor device according to claim 18, further comprising:
a redistribution line, wherein the first metal layer pad is a redistribution pad and is part of and integral with the redistribution line.

21. The semiconductor device according to claim 20, wherein
the substrate comprises a semiconductor die, the semiconductor die comprising a contact pad, the contact pad being connected with the first metal layer pad at least in part by means of the redistribution line.

\* \* \* \* \*